US012628441B2

(12) United States Patent     (10) Patent No.:   US 12,628,441 B2

Chen et al.     (45) Date of Patent:    May 12, 2026

(54) QUANTUM DETECTOR WITH VERTICALLY STACKED STRUCTURE

(71) Applicant: National Atomic Research Institute, Taoyuan (TW)

(72) Inventors: Po-Wen Chen, New Taipei (TW); Jiun-Shen Chen, Taipei (TW); I-Lin Ho, Kaohsiung (TW); Chi-Tsu Yuan, Taoyuan (TW)

(73) Assignee: National Atomic Research Institute, Taoyuan (TW)

( * ) Notice: Subject to any disclaimer, the term of this patent is extended or adjusted under 35 U.S.C. 154(b) by 386 days.

(21) Appl. No.: 18/416,536

(22) Filed: Jan. 18, 2024

(65) Prior Publication Data

US 2025/0294897 A1    Sep. 18, 2025

(30) Foreign Application Priority Data

Oct. 13, 2023    (TW) ................................. 112139224

(51) Int. Cl.

| | |
|---|---|
| *H10F 30/21* | (2025.01) |
| *H10F 30/223* | (2025.01) |
| *H10F 39/10* | (2025.01) |
| *H10F 77/14* | (2025.01) |
| *H10N 50/01* | (2023.01) |
| *H10N 50/85* | (2023.01) |

(52) U.S. Cl.

CPC ......... *H10F 30/288* (2025.01); *H10F 30/223* (2025.01); *H10F 39/103* (2025.01); *H10F 77/1433* (2025.01); *H10N 50/01* (2023.02); *H10N 50/85* (2023.02)

(58) Field of Classification Search

CPC ... H10F 30/288; H10F 39/103; H10F 77/1433

See application file for complete search history.

(56) References Cited

U.S. PATENT DOCUMENTS

| | | | |
|---|---|---|---|
| 2005/0017176 A1* | 1/2005 | Koch ................... | H10D 62/814 |
| | | | 257/E31.022 |
| 2018/0331240 A1* | 11/2018 | Yoshikawa ........... | H10F 77/146 |

\* cited by examiner

*Primary Examiner* — Nduka E Ojeh

(74) *Attorney, Agent, or Firm* — Demian K. Jackson; Jackson IPG PLLC

(57) ABSTRACT

A quantum detector is provided with a vertically stacked structure. The detector comprises a conductive substrate, a plurality of quantum detectors configured on the conductive substrate, and a lower electrode. Each of the quantum detectors comprises an electron transport layer (GaAs), a three-dimensional topological insulator layer (Sb-doping $Bi_2Te_3$), a light-absorbing layer (e.g. having excellent graphene quantum dot (ZnO)), and an upper electrode. The lower electrode is disposed between first and second upper electrodes of the first and second quantum detectors that are adjacent to each other to provide a vertical series of electrical coupling. Thus, the present invention provides a novel photodetector with a vertical structure. With the preparation of a topological material through high-power impulsed magnetron sputtering (having a special surface state of an extremely-low energy gap), the mobility of electron-hole-pair carriers is effectively improved. The whole device achieves low energy consumption and extended use life.

9 Claims, 3 Drawing Sheets

100

QUANTUM DETECTOR WITH VERTICALLY STACKED STRUCTURE

TECHNICAL FIELD OF THE INVENTION

The present invention relates to quantum detector; more particularly, to a photodetector (PD) with a vertical structure, where, by being fabricated through high-power pulsed magnetron sputtering (HiPIMS), a topological material (having a special surface state of an extremely low energy gap (Eg)) is effectively improved in the mobility of electron-hole-pair carriers; and the whole device achieves low energy consumption and extended use life.

DESCRIPTION OF THE RELATED ARTS

In recent years, optical detector technology has been widely used in optical imaging, Internet-of-Things communication, biomedicine, and other fields, which plays an important role in promoting the development of related applications of national defense and people's livelihood. Currently, commercialized PDs are mainly composed of inorganic semiconductor materials such as silicon (Si) substrates, germanium (Ge) substrates, indium gallium arsenide (InGaAs), and mercury cadmium telluride (HgCdTe). However, these materials have insufficient detection capabilities in weak light and infrared light bands, where multi-layer stacking is required for amplifying optical signals. This results in limitations, like complex manufacturing procedure, increased process difficulty, and expensive equipment, to the development of these materials. The detection capabilities of traditional semiconductor materials are mainly limited in photosensitive materials, which can only cover a certain waveband area. Especially in the areas of mid-far infrared and megahertz bands, there is a lack of novel and efficient photosensitive materials. The three-dimensional (3D) topological insulator was experimentally confirmed in 2020 at the first time that, owing to its topological surface state of an extremely low Eg, an extremely wide absorption-band capability and an ultra-high drift rate were obtained and the operation with low energy consumption was possible. A quantum detector composing the topological insulators can be used in applications of wide spectrum, from visible light to megahertz bands, for broad prospects.

However, as far as the current manufacturing process is concerned, most of the mass production technologies of PD manufacturers still use molecular beam epitaxy equipment to produce 3D topological materials, resulting in high production costs and inability of effective mass-production. Moreover, due to the especially high dark current of conventional PD, the detection capability is poor and it is difficult to distinguish the current response. Even with light illumination, the current difference is very small and, thus, the ability of accurately measuring low-intensity light is limited. Hence, the prior arts do not fulfill all user's requests on actual use.

SUMMARY OF THE INVENTION

The main purpose of the present invention is to stacking a total current with a vertically-structured currents connected in series, where, on being shone by light, a larger current is generated and dark current is reduced to improve sensitivity to light and responsibility to light source; and, according to the novel structure, the ability of accurately measuring low-intensity light is improved for the whole device.

Another purpose of the present invention is to fabricating a 3D topological insulator layer through low-cost HiPIMS, where no thermal annealing is required and, therefore, the overall process is fast.

To achieve the above purposes, the present invention is a quantum detector with a vertically stacked structure, comprising a conductive substrate, a plurality of quantum detectors set on the conductive substrate, and a lower electrode set on the conductive substrate, where each of the quantum detectors comprises an electron transport layer set on the conductive substrate, a 3D topological insulator layer obtained through HiPIMS and configured on the electron transport layer, an absorbing layer configured on the 3D topological insulator layer, and an upper electrode configured on the absorbing layer; and the lower electrode is configured between a first and a second ones of the upper electrodes of a first and second ones of the quantum detectors that are adjacent to each other to provide parallel connections of electrical coupling. Accordingly, a novel quantum detector with a vertically stacked structure is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
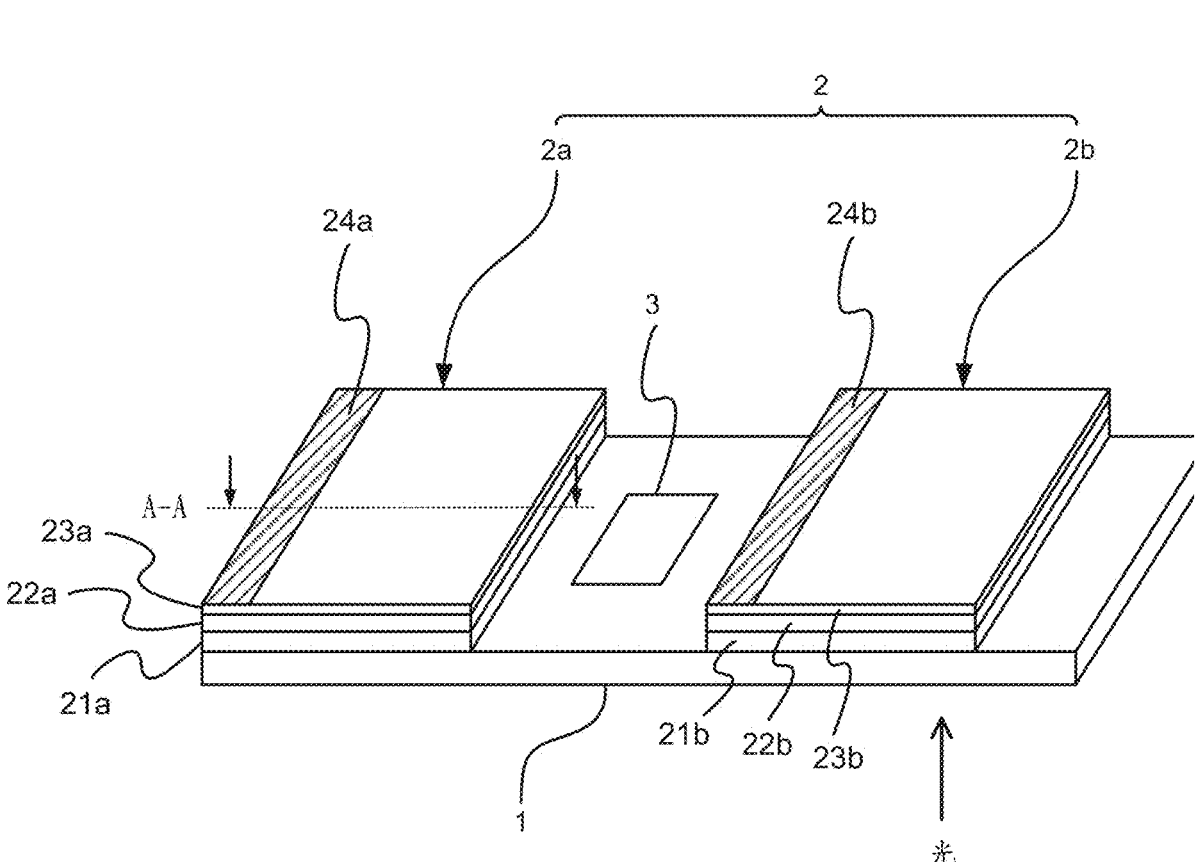
FIG. 1 is the perspective view showing the preferred embodiment according to the present invention.
Figure 2:
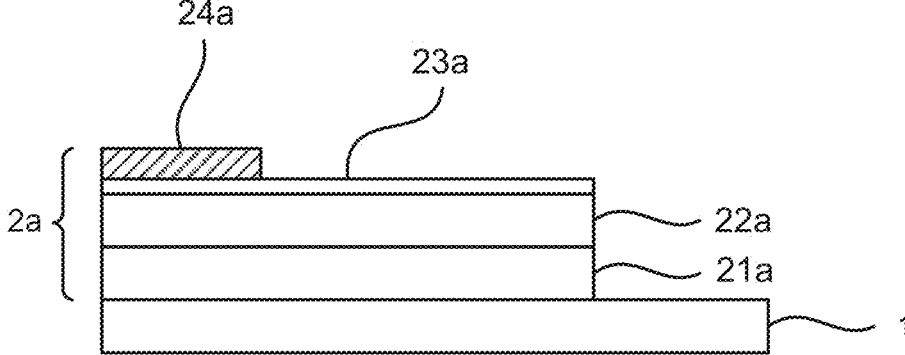
FIG. 2 is the view showing the A-A cross section of FIG. 1.
Figure 3:
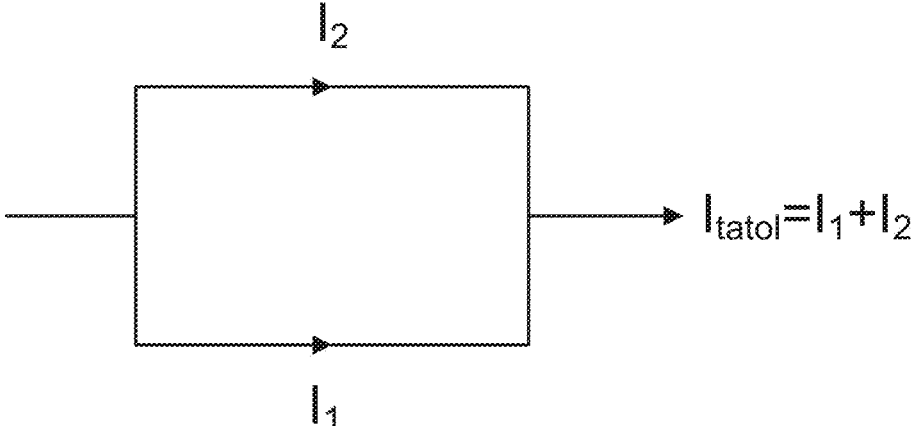
FIG. 3 is the view showing the parallelly-connected currents totaled through the vertically stacked structure.

Please refer to FIG. 1 to FIG. 3, which are a perspective view showing a preferred embodiment according to the present invention; a view showing an A-A cross section of FIG. 1; and a view showing parallelly-connected currents totaled through a vertically stacked structure. As shown in the figures, the present invention is a quantum detector with a vertically stacked structure 100, comprising a conductive substrate 1; a plurality of quantum detectors 2 configured on the conductive substrate 1; and a lower electrode 3.

Each quantum detector 2a,2b of the quantum detectors 2 comprises an electron transport layer 21a,21b configured on the conductive substrate 1; a three-dimensional (3D) topological insulator layer 22a,22b fabricated through high-power impulse magnetron sputtering (HiPIMS) to be configured on the electron transport layer 21a,21b; a light-absorbing layer 23a,23b configured on the 3D topological insulating layer 22a,22b; and an upper electrode 24a,24b configured on the absorbing layer 23a,23b.

The lower electrode 3 is configured between a first and a second upper electrodes 24a,24b of a first and a second quantum detectors 2a,2b that are adjacent to each other as shown in FIG. 1 and FIG. 2. Thus, a novel quantum detector with a vertically stacked structure 100 is obtained.

In a state-of-use, the conductive substrate 1 is of a transparent conductive glass coated with an indium tin oxide (ITO) film.

In a state-of-use, the electron transport layer $21a,21b$ is of a photosensitive material of gallium arsenide (GaAs), which is fabricated through metal-organic chemical vapor deposition (MOCVD).

In a state-of-use, the 3D topological insulator layer $22a$, $22b$ is of a photosensitive material of antimony (Sb)-doping bismuth telluride ($Bi_2Te_3$), which is fabricated through HiPIMS to obtain a highly conductive surface having a surface state of a very low energy-gap (Eg) for a high-speed transmission.

In a state-of-use, the 3D topological insulator layer $22a$, $22b$ is a technical feature, which is prepared by the low-cost HiPIMS of using a required single crystal structure (XRD is available) as Eg<<1 eV. As compared with all traditional commercial products prepared through molecular beam epitaxy (MBE) with very expensive cost while mass production is unavailable, the present invention adjusts different spectrums to obtain high-quality spectra. The HiPIMS used in the present invention has an operation condition of a frequency of 100~350 kilo-hertz (kHz), a power of 20~50 watts (W), an air pressure of $3\times10^{-3}$~$2\times10^{-2}$ Torr, and a temperature of 150~220 degrees Celsius (° C.). This method eliminates the need for thermal annealing, and, hence, the process is fast with energy consumption effectively saved.

In a state-of-use, the 3D topological insulator layer $22a$, $22b$ is fabricated through the HiPIMS to control different impulse frequencies for achieving a single crystal structure, where another target can also be set up to be co-plated at the same time for targeting at a Bi/Te ratio making up a general deficiency of Te for obtaining a high-quality quantum material easily.

In a state-of-use, a low-cost plasma coating device is used to finish doping by installing just another target gun, which is conformed to a single manufacture without breaking vacuum or replacing multiple layers; and the overall yield is improved.

In a state-of-use, the absorbing layer $23a,23b$ is of excellent graphene quantum dot or molybdenum disulfide ($MoS_2$) quantum dot.

In a state-of-use, the graphene quantum dot is obtained through chemical synthesis, whose main function is to increase absorption spectrum and the quantum material is zinc oxide (ZnO) for forming graphene ZnO quantum dot.

In a state-of-use, the upper electrode $24a,24b$ is a silver electrode, where the 3D topological insulator layer $22a,22b$ is fabricated through the low-cost HiPIMS without thermal annealing for a fast overall process and an effectively-reduced energy consumption. With the coordination of connecting the first and second quantum detectors in parallel through vertically-structured currents ($I_1$, $I_2$) as shown in FIG. 3, the total current is stacked (i.e. $I_{total}=I_1+I_2$). On being shone by light, a larger current is generated and dark current is reduced to improve sensitivity to light and responsibility to light source. Hence, with the novel structure, the ability of accurately measuring low-intensity light is improved for the whole device.

To sum up, the present invention is a quantum detector with a vertically stacked structure, where a novel photodetector is provided with a vertical structure; and, with the preparation of a topological material through HiPIMS (having a special surface state of an extremely low Eg), the mobility of electron-hole-pair carriers is effectively improved; and the whole device achieves low energy consumption and extended use life.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A quantum detector with a vertically stacked structure, comprising:
   a conductive substrate;
   a plurality of quantum detectors configured on said conductive substrate,
       wherein each of said quantum detectors comprises
           an electron transport layer configured on said conductive substrate;
           a three-dimensional (3D) topological insulator layer obtained through high-power impulse magnetron sputtering (HiPIMS) and configured on said electron transport layer;
           an absorbing layer configured on said 3D topological insulator layer; and
           an upper electrode configured on said absorbing layer; and
   a lower electrode configured on said conductive substrate,
       wherein said lower electrode is configured between a first and a second ones of said upper electrodes of a first and second ones of said quantum detectors that are adjacent to each other to provide parallel connections of electrical coupling.

2. The quantum detector according to claim 1, wherein said conductive substrate is a transparent conductive glass coated with an indium tin oxide (ITO) film.

3. The quantum detector according to claim 1, wherein said electron transport layer is of a photosensitive material.

4. The quantum detector according to claim 3, wherein said photosensitive material is gallium arsenide (GaAs) made into said electron transport layer through metal-organic chemical vapor deposition (MOCVD).

5. The quantum detector according to claim 1, wherein said 3D topological insulator layer is of a photosensitive material.

6. The quantum detector according to claim 5, wherein said photosensitive material is bismuth telluride doped with antimony ($S_b$-doping $Bi_2Te_3$) to be made into said 3D topological insulator layer through HiPIMS, and has a surface state of an extremely low energy gap.

7. The quantum detector according to claim 1, wherein said HiPIMS has an operating condition comprising a frequency of 100~350 kilo-hertz (kHz), a power of 20~50 watts (W), an air pressure of $3\times10^{-3}$~$2\times10^{-2}$ Torr, and a temperature of 150~220 degrees Celsius (° C.).

8. The quantum detector according to claim 1, wherein said absorbing layer is of a material selected from a group consisting of graphene quantum dot and molybdenum disulfide ($MoS_2$) quantum dot.

9. The quantum detector according to claim 8, wherein said graphene quantum dot is of zinc oxide (ZnO) made into graphene ZnO quantum dot through chemical synthesis.

* * * * *